United States Patent
Takayama et al.

(10) Patent No.: US 7,453,094 B2
(45) Date of Patent: Nov. 18, 2008

(54) LIGHT-EMITTING APPARATUS AND FABRICATION METHOD OF THE SAME

(75) Inventors: Toru Takayama, Kanagawa (JP);
Takuya Tsurume, Kanagawa (JP);
Yuugo Goto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/662,508

(22) Filed: Sep. 16, 2003

(65) Prior Publication Data
US 2004/0079950 A1  Apr. 29, 2004

(30) Foreign Application Priority Data
Sep. 20, 2002  (JP) ............................. 2002-276374

(51) Int. Cl.
*H01L 27/15* (2006.01)
(52) U.S. Cl. .............................. 257/83; 257/57; 257/59; 257/368; 257/E33.002
(58) Field of Classification Search ................ 257/347, 257/40, 57–59, 71, 351, 357, 365, 79–82, 257/72, 83, 257, 290, 368; 313/504–506
See application file for complete search history.

(56) References Cited

U.S. PATENT DOCUMENTS

| 3,977,767 | A |   | 8/1976  | Okuma et al. |
|-----------|---|---|---------|--------------|
| 4,455,324 | A | * | 6/1984  | Kamijo et al. ................ 427/66 |
| 4,580,818 | A |   | 4/1986  | Lyng |
| 5,078,634 | A | * | 1/1992  | Yoshioka ...................... 445/25 |
| 5,188,876 | A |   | 2/1993  | Hensel et al. |
| 5,505,985 | A |   | 4/1996  | Nakamura et al. |
| 5,834,327 | A |   | 11/1998 | Yamazaki et al. |
| 5,952,778 | A | * | 9/1999  | Haskal et al. ................ 313/504 |

(Continued)

FOREIGN PATENT DOCUMENTS

CN  1 399 502  2/2003

(Continued)

OTHER PUBLICATIONS

Search Report (Application No. 03021328.4) dated May 15, 2007.

(Continued)

*Primary Examiner*—Wai-Sing Louie
(74) *Attorney, Agent, or Firm*—Fish & Richardson P.C.

(57) ABSTRACT

The present invention is to use a film containing fluoroplastics that is capable of forming into a lamination as a protective film for protecting a light-emitting device against moisture or gas such as oxygen so as to prevent of deterioration of the light-emitting device easier and improve reliability of the light-emitting device greater than the conventional light-emitting apparatus. In the present invention, another film can be stacked on the film containing fluoroplastics by forming irregularities by means of the surface preparation on the film containing fluoroplastics or by controlling the content of fluoroplastics in the film containing fluoroplastics. In addition, in the case that another film is stacked on the film containing fluoroplastics by controlling the content of fluoroplastics, the content of fluoroplastics can be controlled by means of forming the film containing fluoroplastics by sputtering using sequentially a plurality of targets that has different contents of fluoroplastics and metallic oxides.

16 Claims, 10 Drawing Sheets

U.S. PATENT DOCUMENTS

| | | | |
|---|---|---|---|
| 6,027,958 A | 2/2000 | Vu et al. | |
| 6,118,212 A | 9/2000 | Nakaya et al. | |
| 6,198,092 B1 | 3/2001 | Bulovic et al. | |
| 6,198,220 B1 * | 3/2001 | Jones et al. | 313/512 |
| 6,274,887 B1 | 8/2001 | Yamazaki et al. | |
| 6,372,608 B1 | 4/2002 | Shimoda et al. | |
| 6,429,584 B2 | 8/2002 | Kubota | |
| 6,445,005 B1 | 9/2002 | Yamazaki et al. | |
| 6,479,930 B1 * | 11/2002 | Tanabe et al. | 313/509 |
| 6,488,555 B2 * | 12/2002 | Pichler et al. | 445/24 |
| 6,583,440 B2 * | 6/2003 | Yasukawa | 257/59 |
| 6,633,121 B2 | 10/2003 | Eida et al. | |
| 6,638,645 B2 | 10/2003 | Sawai et al. | |
| 6,642,107 B2 * | 11/2003 | Seo et al. | 438/257 |
| 6,652,938 B1 * | 11/2003 | Nishikawa et al. | 428/35.9 |
| 6,689,492 B1 | 2/2004 | Yamazaki et al. | |
| 6,792,333 B2 * | 9/2004 | Yamazaki | 700/227 |
| 6,800,378 B2 * | 10/2004 | Hawa et al. | 428/688 |
| 6,828,727 B2 | 12/2004 | Yamazaki | |
| 6,872,473 B2 * | 3/2005 | Song et al. | 428/690 |
| 6,874,399 B2 | 4/2005 | Lee | |
| 6,896,979 B2 | 5/2005 | Sawai et al. | |
| 6,919,681 B2 * | 7/2005 | Cok et al. | 313/500 |
| 6,924,594 B2 | 8/2005 | Ogura et al. | |
| 6,943,369 B2 * | 9/2005 | Hayashi | 257/40 |
| 6,978,707 B2 | 12/2005 | Lee | |
| 2001/0026846 A1 | 10/2001 | Yamazaki et al. | |
| 2001/0055841 A1 | 12/2001 | Yamazaki et al. | |
| 2002/0056842 A1 | 5/2002 | Yamazaki | |
| 2002/0057055 A1 * | 5/2002 | Yamazaki et al. | 313/506 |
| 2002/0125817 A1 | 9/2002 | Yamazaki et al. | |
| 2002/0153833 A1 * | 10/2002 | Wu | 313/506 |
| 2002/0168545 A1 | 11/2002 | Sawai et al. | |
| 2002/0190256 A1 | 12/2002 | Murakami et al. | |
| 2003/0001992 A1 * | 1/2003 | Kawase et al. | 349/106 |
| 2003/0030369 A1 | 2/2003 | Shih et al. | |
| 2003/0032210 A1 | 2/2003 | Takayama et al. | |
| 2003/0057422 A1 * | 3/2003 | Yamazaki et al. | 257/79 |
| 2003/0064569 A1 | 4/2003 | Takayama et al. | |
| 2003/0067266 A1 * | 4/2003 | Kim et al. | 313/504 |
| 2003/0143319 A1 * | 7/2003 | Park et al. | 427/64 |
| 2003/0213956 A1 | 11/2003 | Hioki et al. | |
| 2004/0004214 A1 * | 1/2004 | Yamazaki et al. | 257/40 |
| 2004/0056589 A1 * | 3/2004 | Yamazaki et al. | 313/506 |
| 2004/0061438 A1 | 4/2004 | Yamazaki et al. | |
| 2004/0099926 A1 | 5/2004 | Yamazaki et al. | |
| 2004/0150332 A1 * | 8/2004 | Hwang et al. | 313/512 |
| 2004/0187917 A1 * | 9/2004 | Pichler | 136/263 |
| 2005/0093436 A1 | 5/2005 | Yamazaki | |
| 2005/0257657 A1 | 11/2005 | Lee | |
| 2005/0260337 A1 | 11/2005 | Ogura et al. | |

FOREIGN PATENT DOCUMENTS

| | | | |
|---|---|---|---|
| EP | 0 880 307 A2 | 11/1998 | |
| EP | 1 058 484 A1 | 12/2000 | |
| EP | 1 176 850 A1 | 1/2002 | |
| EP | 1 278 244 | 1/2003 | |
| EP | 1 870 948 A2 | 12/2007 | |
| JP | 60115944 A * | 6/1985 | 430/66 |
| JP | 03153859 A * | 7/1991 | |
| JP | 05-036475 | 2/1993 | |
| JP | 05-089959 | 4/1993 | |
| JP | 05-101884 | 4/1993 | |
| JP | 06-306591 | 11/1994 | |
| JP | 07-003438 | 1/1995 | |
| JP | 07-015049 | 1/1995 | |
| JP | 07-169567 | 7/1995 | |
| JP | 07292459 A * | 11/1995 | |
| JP | 2597047 | 4/1997 | |
| JP | 09-175837 | 7/1997 | |
| JP | 10-125929 | 5/1998 | |
| JP | 2001-189114 | 7/2001 | |
| JP | 2001-284041 | 10/2001 | |
| JP | 2002-184569 | 6/2002 | |
| JP | 2002-208477 | 7/2002 | |
| JP | 2002-260848 | 9/2002 | |
| TW | 490868 | 6/2002 | |
| WO | WO 01/58221 A1 | 8/2001 | |

OTHER PUBLICATIONS

Chinese Office Action (Application No. 200310058661.9), dated Jan. 4, 2008.

Shunpei Yamazaki et al.; U.S. Patent Application entitled "Light-Emitting Apparatus" filed concurrently herewith (Sep. 16, 2003); Specification, claims, drawings—35 pages.

* cited by examiner

FIG. 5A SURFACE TREATMENT

FIG. 5B FORMING OF RESIST

FIG. 5C ETCHING PROCESS

LIGHT-EMITTING APPARATUS AND FABRICATION METHOD OF THE SAME

BACKGROUND OF THE INVENTION

1. Field of the Invention

The present invention relates to a light-emitting apparatus comprising a light-emitting device, which emits fluorescent light or phosphorescent light upon application of an electric field thereto, including a pair of electrodes and an electroluminescent layer that is sandwiched between the pair of electrodes, and to a method of fabricating the light-emitting apparatus. Particularly, the present invention relates to technique for preventing moisture or oxygen from penetrating into the light-emitting device formed on a substrate by using a film containing fluoroplastics. In this specification, the term light-emitting apparatus includes an image display apparatus, a light-emitting device, or a light source (including a lighting system). Also, the following modules are included in the light-emitting apparatus: a module obtained by attaching a connector such as an FPC (flexible printed circuit), a TAB (tape automated bonding) tape, or a TCP (tape carrier package) to a light-emitting device; a module obtained by providing a printed wiring board with a tip of a TAB tape or a TCP; and a module obtained by mounting directly an IC (integrated circuit) to a light-emitting device by the COG (chip on glass) system.

2. Description of the Related Art

A light-emitting device, in which a material characterized by their thinness and light weight, fast response, and direct current low voltage driving is used as an illuminant, is expected to be applied to next-generation flat panel displays. Particularly, a light-emitting apparatus in which light-emitting devices are arranged in matrix are considered to be superior to the conventional liquid crystal display devices for their wide viewing angle and excellent visibility.

The luminescent mechanism of light-emitting device is as follows: voltage is applied to a pair of electrodes that sandwich an electroluminescent layer, and electrons injected from a cathode and holes injected from an anode are re-combined at the luminescent center of the electroluminescent layer to form molecular excitons, and then the molecular excitons return to the base state while releasing energy, consequently, luminescence is generated in the electroluminescent layer. Known excitation states are singlet excitation and triplet excitation, and it is considered that luminescence can be generated by either excitation states.

However, a light-emitting apparatus has a problem in the fabrication process, the problem is different from that of another display apparatuses such as a liquid crystal display apparatus, or the like.

It is known that a light-emitting device is deteriorated by moisture. Specifically, due to moisture, exfoliation between an electroluminescent layer and a electrode, deterioration of a material for forming an electroluminescent layer, generation of non light emitting portion referred to as a dark spot, or shrinkage of a light emitting portion resulting to inferior luminescence are seen in the light-emitting device. Such deterioration of the light-emitting device causes decreasing reliability of a light-emitting device in a long-time-driving.

The technique is known for solving the above described problems that Teflon®AF (a product by DuPont Corp.), polymer of Teflon® is formed by vapor deposition to seal a light-emitting device (for example, Reference 1: Patent Publication No. 2,597,047). Although the resulted film is effective for protecting the device from moisture or gas such as oxygen or the like, the film has some problems due to its peculiarities such that another film cannot be stacked on the resulted film. Consequently, the film cannot be patterned and can be formed exclusively on the surface of the light-emitting device.

On the contrary, the technique of forming a water-shedding film that is superior in abrasion-resistance by forming a mixed film of metallic oxides and fluoroplastics (for example, Reference 2: Unexamined Patent Publication No. 6-306591). The film has a merit of having advantages of both metallic oxides and fluoroplastics, on the other hand, the film has a demerit of having insufficient advantages in comparison with a single film.

As another solution, it is known that the technique of covering the external surface of the device by a dampproof film (for example, Reference 3: Unexamined Patent Publication No. 5-101884), or pasting an airtight case to a substrate for encapsulating a light-emitting device into an airtight space that is cutoff from the outside (sealing technique) (for example, Reference 4: Unexamined Patent Publication No. 5-36475 and Unexamined Patent Publication No. 5-89959). However, in this case, there is also problem of increasing the number of processes such as covering by a dampproof film, or pasting an airtight case a substrate, and there is a threat of further deterioration of a light-emitting device due to penetration of moisture or gas such as oxygen or the like thereinto during these processes.

Therefore attention is paid to how to give easily a light-emitting device a function of being protected against moisture or gas such as oxygen or the like without increasing the complicated processes as described above.

SUMMARY OF THE INVENTION

In view of the foregoing, it is an object of the present invention is to prevent deterioration of a light-emitting device and improve reliability of the light-emitting device by using a film containing fluoroplastics, which is capable of being laminated, as a protective film for protecting a light-emitting device against moisture or gas such as oxygen or the like.

In the present invention, for solving the above described problems, the surface preparations is made on a film containing fluoroplastics in order to form irregularities on the surface and to control fluoroplastics content in a film containing fluoroplastics, consequently, another film becomes able to stack on the film containing fluoroplastics.

In the case that another film is stacked on a film containing fluoroplastics by controlling fluoroplastics content in a film containing fluoroplastics, fluoroplastics content in a film containing fluoroplastics is controlled by forming the film by sputtering using sequentially plural targets of fluoroplastics and metallic oxides each of which has different contents of fluoroplastics and metallic oxides by percentage. Specifically, the surface metallic oxides content can be increased by depositing the film by means of using the target that has small amount of metallic oxides content at the beginning, subsequently, using sequentially the target that has more amount of that than the previous one, and so on, with the deposition time.

A specific constitution according to the present invention is: a light-emitting apparatus having a light-emitting device including a first electrode, an electroluminescent film formed on the first electrode, and a second electrode formed on the electroluminescent film, comprising:

a film containing fluoroplastics formed on the second electrode; and an inorganic insulating film formed on the film containing fluoroplastics.

In the above constitution, a film containing fluoroplastics is formed to cover the light-emitting device for preventing deterioration of the light-emitting device due to moisture or gas such as oxygen or the like.

For fabricating a film containing fluoroplastics according to the present invention, the target materials such as polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like is used.

In addition, in the above constitution, an inorganic insulating film that is formed on a film containing fluoroplastics has a characteristic of having higher hardness than that of a film containing fluoroplastics and having high barrier property against external shocks. Specifically, the film that contains silicon nitride, silicon oxide, silicon oxynitride, or the like, formed by sputtering, CVD, or vapor deposition, in addition, a thin film containing carbon as its main components or the like (for example, a DLC film or CN film) are useful. A lamination structure of above described film containing fluoroplastics and inorganic insulating film can provide both of their functions that preventing moisture or gas such as oxygen or the like from penetrating into the light-emitting device and enhancing tolerance of the light-emitting device for external shocks, respectively.

Another constitution according to the present invention is: a light-emitting apparatus having a light-emitting device including a first electrode connecting electrically to a TFT formed on a substrate via an insulating film, an electroluminescent film formed on the first electrode, and a second electrode formed on the electroluminescent film, comprising:

a film containing fluoroplastics formed on the second electrode; and an inorganic insulating film formed on the film containing fluoroplastics.

In each above constitution, the insulating film may have a lamination structure comprising a first insulating film formed of any one of acrylic, polyamide, or polyimide and a second insulating film formed of a film containing fluoroplastics formed thereon, or may have a single layer structure comprising a film containing fluoroplastics.

Another more constitution according to the present invention is: a fabrication method of a light-emitting apparatus including a first electrode, a second electrode, and an electroluminescent film disposed between the first electrode and the second electrode, comprising the steps of:

forming a film containing fluoroplastics on the second electrode by sputtering;

processing a surface of the film containing fluoroplastics in plasma (including reverse sputtering); and forming an inorganic insulating film on the film containing fluoroplastics.

Specifically, the reverse sputtering treatment among plasma treatment in above constitution is carried out under the conditions, that is, Ar gas used as process gas is 50 sccm; sputtering pressure used is 0.67 Pa; high-frequency power applied is from 20 kHz to 27 MHz; RF power, 500 W; the substrate temperature is from room temperature to not more than 200° C.; and processing time, from 5 to 20 minutes.

In the above constitution, the case that the first electrode is connected electrically to the TFT formed on the substrate has the same constitution as above that.

In the case that a second insulating film formed of a film containing fluoroplastics is stacked on a first insulating film formed of a photosensitive organic resin film by sputtering, the surface of the second insulating film is plasma treated (as well as reverse sputtered), and an inorganic insulating film is formed on the film containing fluoroplastics.

Further, in the case that a film containing fluoroplastics is formed by high-frequency sputtering, plural targets of metallic oxides, fluoroplastics, or a mixture of metallic oxides and fluoroplastics are used sequentially.

For the metallic oxides in the above constitution, for example, a material such as a silicon oxide, an aluminum oxide, a zirconium oxide, a titanium oxide, or the like, is useful.

In the resulted mixed film of fluoroplastics and metallic oxides formed using the above described plural targets, the mixed film metallic oxide content is increased in the region near the film surface.

Increasing the metallic oxides content at the film surface, the fluoroplastics content is decreased and the surface characteristics of the resulted film can be made close to that of the metallic oxides. Consequently, the problems that another film can not be formed on the film containing can be solved.

DESCRIPTION OF THE PREFERRED EMBODIMENT

In Embodiment Mode 1, the case in which a film containing fluoroplastics and an inorganic insulating film for preventing deterioration of a light-emitting device are formed after forming the light-emitting device on a second electrode will be described with reference to FIG. 1. In Embodiment Mode 1, the case that inorganic insulating film becomes able to be formed by carrying out the surface preparations on the surface of a film containing fluoroplastics will be described.

In the present invention, there are a bottom emitting type light-emitting apparatus in which light generated in a light-emitting device emits in the direction of the substrate on which TFT is formed and a top emitting type light-emitting apparatus in which light generated in a light-emitting device emits in the opposite direction of the substrate. In this embodiment mode, the case of using a top emitting type light-emitting apparatus will be described.

Figure 1A:
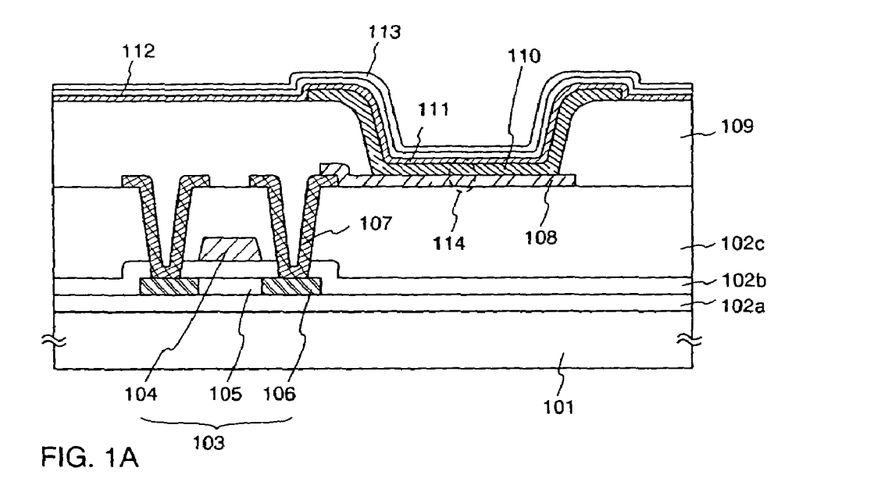
FIGS. 1A to 1C are views showing a structure of a light-emitting apparatus.
Figure 1B:
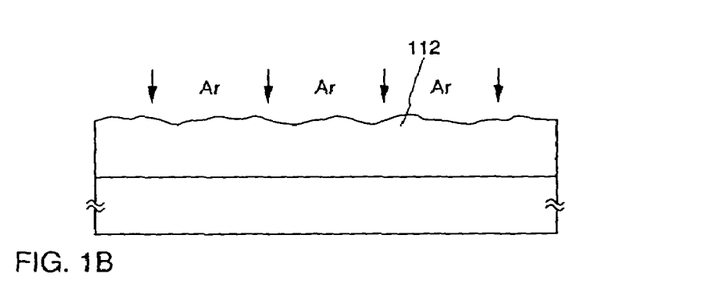
Figure 1C:
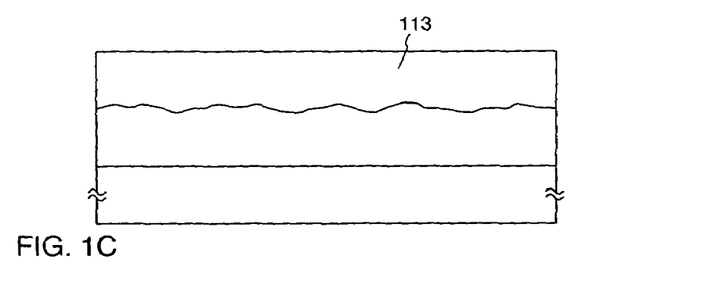

FIG. 1A is a cross-sectional view showing a part of a pixel portion. In FIG. 1A, reference numeral 101 is a first substrate; 102a, 102b, 102c are insulating layers; 103 is a TFT (including a gate electrode 104, a channel formation region 105, and an impurity region 106); 107 is a wiring; 108 is a first electrode; 109 is an insulating film; 110 is an electroluminescent layer; 111 is a second electrode; 112 is a film containing fluoroplastics; and 113 is an inorganic insulating film.

The insulating layer 102a that serves as a base insulating film (here, a bottom layer is a nitride insulating film, and an upper layer is an oxide insulating film) is formed on the first substrate 101, and the insulating layer 102b is formed between the gate electrode 104 and an active layer. The insulating layer 102c is formed that serves as an interlayer insulating film formed of an organic material or an inorganic material is formed on the gate electrode 104.

The TFT 103 (here, p-channel TFT is used) formed on the first substrate 101 in contact with the insulating layer 102a is an element for controlling the current passing through the electroluminescent layer 110. Reference numeral 106 is an impurity region (a drain region or a source region). Reference numeral 107 is a wiring (also referred to as a drain electrode or a source electrode) for connecting a first electrode 108 to the impurity region 106. A current supply line, a source wiring, or the like is formed simultaneously in similar process.

Although not shown here, another not less than one TFT is provided per pixel (an n-channel TFT or a p-channel TFT).

In Embodiment Mode 1, the first electrode 108 serves as an anode. Therefore as a material for forming the first electrode, it is preferable to use a large work function material (not less than 4.0 eV). Specifically, TiN, $TiSi_xN_y$, $WSi_x$, $WN_x$, $WSi_xN_y$, NbN, indium-tin-oxides (ITO), indium-zinc-oxides (IZO), an alloy of indium and one type or plural types of metallic oxides (for example, indium aluminum oxides, indium tungsten oxides, indium germanium oxides, indium titanium oxides, indium tantalum oxides, or the like), or ITO-$SiO_2$ (for example, $In_2O_3:SnO_2:SiO_2=85:10:5$ (wt %), or the like), in addition, an element selected from Ti, Ni, W, Mo, Cr, Pt, Zn, Sn, In, or Mo, a film containing mainly an alloy material or a compound material containing the above described element as its main component, or a lamination film having a total thickness from 100 to 800 nm is useful. Here, a titanium nitride film is used as the first electrode 108. In the case of using the titanium nitride film as the first electrode 108, it is preferable to increase the work function by plasma treatment using UV irradiation or gaseous chlorine.

An insulator 109 (also referred to as a bank) is formed that covers an edge portion of the first electrode 108 (and wiring 107). As a material for the insulator 109, an inorganic material (silicon oxide, silicon nitride, silicon oxynitride, or the like), a photosensitive organic material, a nonphotosensitive organic material (polyimide, acrylic, polyamide, polyimide-amide, resist, or benzocyclobutene), or a lamination layer of these materials can be appropriately used. However, a photosensitive organic resin covered by a silicon nitride film is used for the insulator 109 here. In the case of using a positive type photosensitive acrylic is used as an organic resin material, it is preferable that an only upper edge portion of the insulator is formed to have a curved surface having a radius of curvature. Either a negative type that is a soluble material in etchant according to photosensitive light or a positive type that is dissoluble in etchant according to light can be used as an insulator.

The electroluminescent layer 110 is formed by vapor deposition or coating. In addition, it is preferable that the substrate is heated in vacuum (from 100 to 250° C.) for degasification just before forming the electroluminescent layer 110 in order to improve reliability.

In the case of forming the electroluminescent layer 110 by vapor deposition, for instance, white light emission can be obtained by forming the electroluminescent layer 110 having the configuration: an $Alq_3$ film, an $Alq_3$ film partially doped with Nile red which is a red luminescent pigment, an $Alq_3$ film, a p-EtTAZ film, and a TPD (aromatic diamine) film, sequentially.

On the other hand, when the electroluminescent layer 110 is formed by spin coating, the spin-coated film is preferable to be baked by vacuum heating. For example, an aqueous solution of poly(ethylene dioxythiophene)/poly(styrene sulfonic acid) (PEDOT/PSS) is coated on the entire surface and baked to form a film that serves as a hole injection layer. Then, a polyvinyl carbazole (PVK) solution doped with a luminescence center pigment (such as 1, 1, 4, 4-tetraphenyl-1, 3-butadiene (TPB), 4-dicyanomethylene-2-methyl-6-(p-dimethylamino-styryl)-4H-pyran (DCM1), Nile red, or coumarin 6) is coated on the entire surface and baked to form a film that serves as a light emitting layer.

Although the electroluminescent layer 110 may be formed to have a single layer structure. For example, a 1, 3, 4-oxadiazole derivative (PBD) having an electron transporting property is dispersed in polyvinyl carbazole (PVK) having hole transporting property. Another method to obtain white light emission is to disperse 30 wt % PBD as an electron transporting agent and disperse four kinds of pigments (TPB, coumarin 6, DCM1, and Nile red) in appropriate amounts.

In addition to the white-light-emitting device, red, green, and blue-light-emitting devices can be obtained by selecting appropriately a material for forming the electroluminescent layer 110.

Since a second electrode 111 serves as a cathode for a light-emitting device in Embodiment Mode 1, it is preferable to use a small work function material (not more than 3.5 eV) for forming the second electrode 111. Specifically, an alloy of MgAg, MgIn, AlLi, $CaF_2$, CaN, or the like, or a film that is transparent to light formed of an element belonging 1 group or 2 group in a periodic table and aluminum by co-evaporation.

The top emitting type light-emitting apparatus described in Embodiment Mode 1 requires the second electrode 111 to be transparent to light. Consequently, the second electrode 111 is formed using an aluminum film having a thickness from 1 nm to 10 nm, or an aluminum film containing slight amount of Li. In this case, a layer that is transparent to light can be formed of $CaF_2$, $MgF_2$, or $BaF_2$ (thickness from 1 to 5 nm) as a cathode buffer layer.

In order to decrease resistance of the second electrode 111, it can be formed to be a lamination structure of a thin metal film and a transparent conductive film (Indium-tin-oxide (ITO), indium oxide-zinc oxide ($In_2O_3$—ZnO), zinc oxide (ZnO), or the like). Otherwise, a support electrode can be formed on a part of the second electrode 111 that is not overlapped with a light emitting region.

A film containing fluoroplastics 112 can be formed by sputtering or vapor deposition. The film containing fluoroplastics 112 protects the second electrode 111 and prevents moisture or gas such as oxygen or the like that cause deterioration of a light-emitting device from penetrating into a light-emitting device 114.

For fabrication of a film containing fluoroplastics according to the present invention, the target of polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like is used.

Here, the case that the film containing fluoroplastics 112 is formed by sputtering is described here. The deposition is carried out under the conditions, that is, Ar gas used as process gas is 30 sccm (the 5 sccm $O_2$ gas can be used in addition to the Ar gas); sputtering pressure used is 0.4 Pa; electric power, 400 W; and the substrate temperature, 300° C. The film containing fluoroplastics 112 is formed to have a thickness from 100 to 200 nm.

Next, reverse sputtering treatment is carried out on the surface of the film containing fluoroplastics 112. Specifically, the reverse sputtering treatment is carried out under the conditions, that is, Ar gas used as process gas is 50 sccm ; sputtering pressure used is 0.67 Pa; and electric power, 500 W. The preferable reverse sputtering treatment time is from 5 to 20 min.

For an inorganic insulating film 113 that will be formed next, a silicon nitride film, a silicon oxide film, a silicon oxynitride film (SiNO film (in a composition ratio of N>O) or SiON film (in a composition ratio of N<O)), a thin film containing carbon as its main components (for example, a DLC film, a CN film, or the like) formed by sputtering, CVD, or vapor deposition may be useful.

A lamination structure of the film containing fluoroplastics and inorganic insulating film can provide both of their functions that preventing moisture or gas such as oxygen or the like from penetrating into the light-emitting device and enhancing tolerance of the light-emitting device for external shocks, respectively.

Embodiment Mode 2

In Embodiment Mode 2, the case that a film containing fluoroplastics for preventing deterioration of a light-emitting device is formed before forming a light-emitting device as a part of an insulating film or a whole of a insulating film that is formed between a substrate and a TFT, particularly, the case that the film containing fluoroplastics is formed as a part of the insulating film will be described with reference to FIG. 2.

Figure 2:
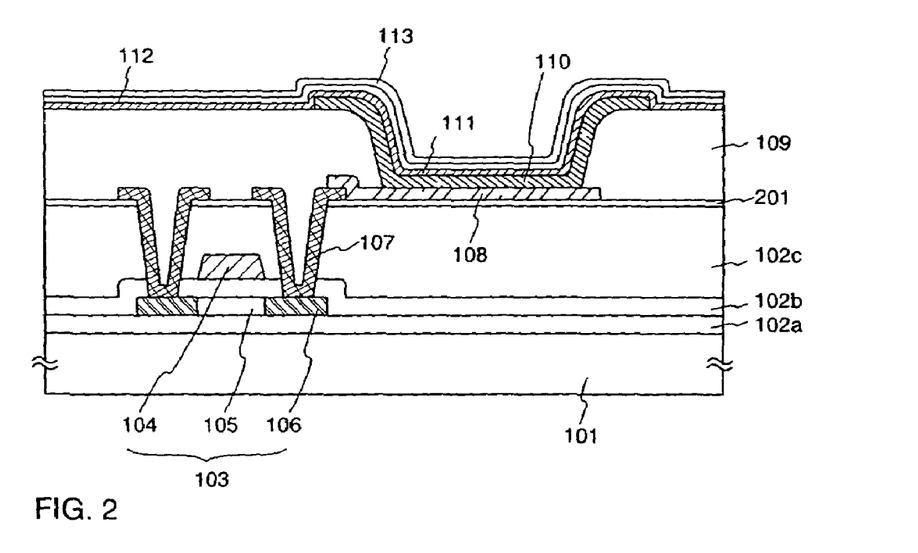
FIG. 2 is a view showing a structure of a light-emitting apparatus.

In FIG. 2, like components except a film containing fluoroplastics used to a part of an insulating film are denoted by like numerals as of the Embodiment Mode 1.

In FIG. 2, a film containing fluoroplastics 201 is formed on an insulating film 102c serving as an interlayer insulating film by sputtering. Then, contact holes are formed in the insulating film 102c and the film containing fluoroplastics 201. Then, a wiring 107 is formed.

In Embodiment Mode 2, since the contact holes are formed by etching off the film containing fluoroplastics 201, the film containing fluoroplastics 201 is deposited by using a target of fluoroplastics and metallic oxides. A target of the fluoroplastics described in Embodiment Mode 1 can also be used.

Figure 3:
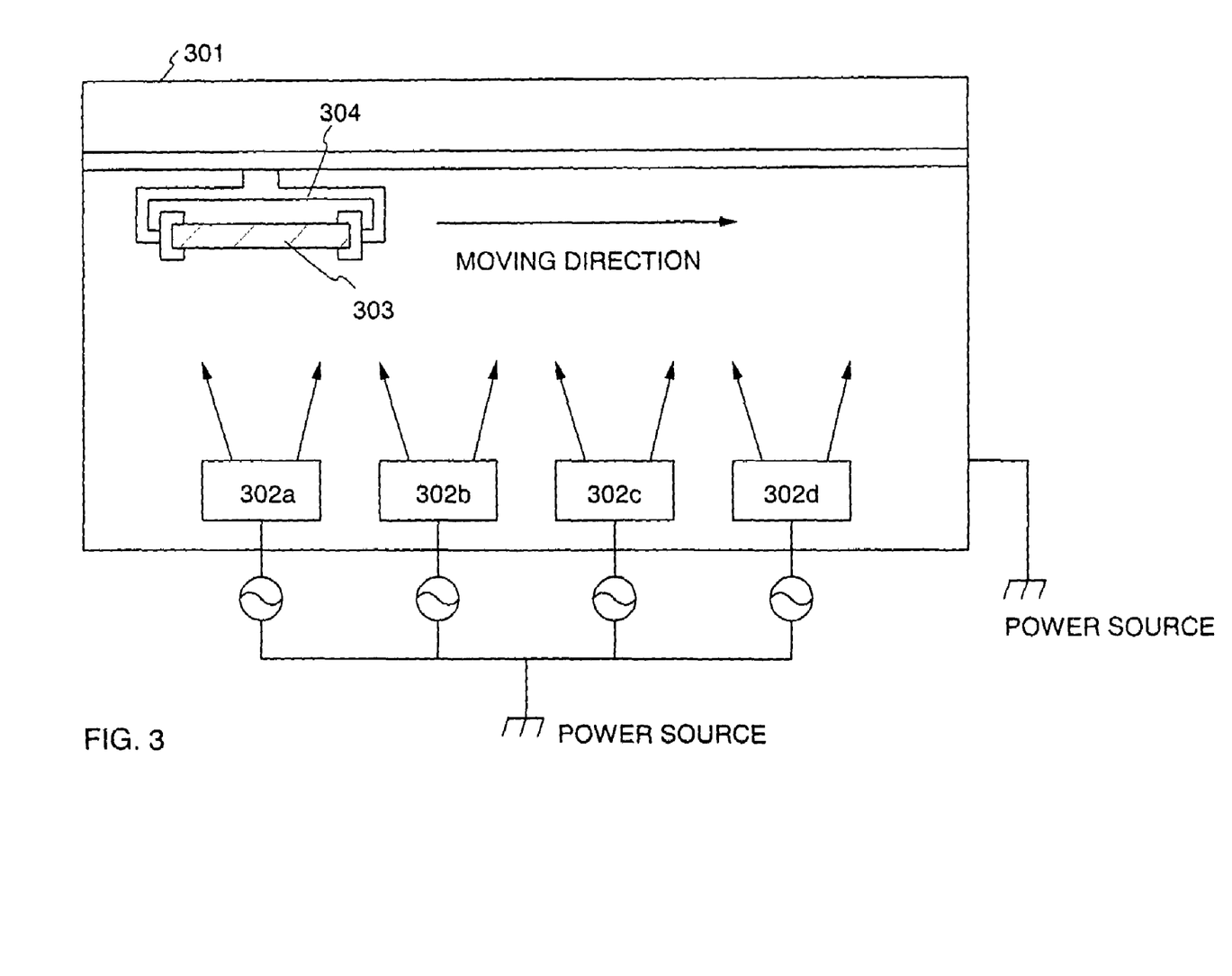
FIG. 3 is a view showing a deposition process for a film containing fluoroplastics.

A deposition method of the film containing fluoroplastics 201 formed of fluoroplastics and metallic oxides is described with reference to FIG. 3. In FIG. 3, reference 301 is a deposition chamber for sputtering. A plurality of targets is mounted inside the deposition chamber 301. By using four kinds of targets, 302a, 302b, 302c, 302d, a film formed of fluoroplastics and metallic oxides is formed on a substrate 303.

The fluoroplastics and metallic oxides contents of each target are different from each other used in this embodiment mode. The targets are comprising one kind or plural kinds of fluoroplastics out of polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like, and one kind or plural kinds of metallic oxides out of silicon oxide, aluminum oxide, zirconium oxide, titanium oxide, or the like.

Vapor deposition is carried out on the substrate 303 while moving the substrate by a transport mechanism 304 in the deposition chamber 301. The mixture ratios of fluoroplastics and metallic oxides in four kinds of targets (a first target 302a, a second target 302b, a third target 302c, a fourth target 302d) used in Embodiment Mode 2 are different from each other. Here, the relationship of the content of fluoroplastics in the respective targets is as follows: the first target 302a>the second target 302b>the third target 302c>the fourth target 302d.

Figure 4A:
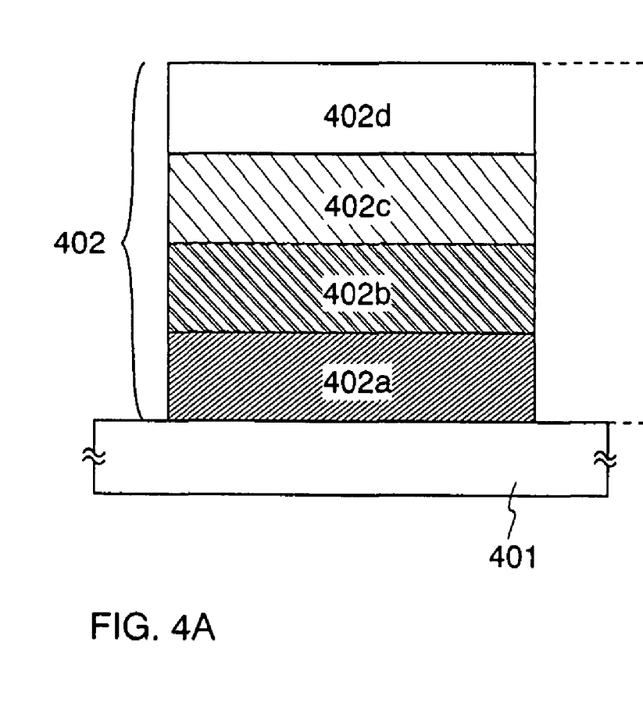
FIGS. 4A and 4B are a view showing components of a film containing fluoroplastics.
Figure 4B:
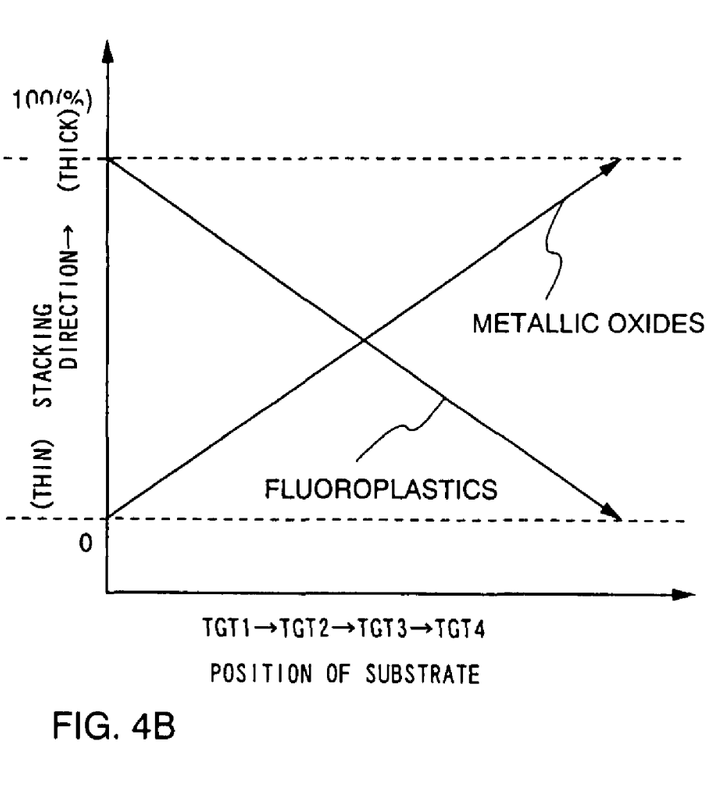

Since the substrate 303 is moved in the direction of an arrow illustrated in FIG. 3 by the transport mechanism 304, the content of fluoroplastics in the deposited film is varied as shown in FIG. 4 by moving the deposition spot (with thickening the film thickness).

Further, FIG. 4A is a view showing a film containing fluoroplastics 402 formed on a substrate 401 in Embodiment Mode 2 (including a film that has already been formed), and FIG. 4B is a graph showing the content of fluoroplastics and metallic oxides in the film 402. The axis of abscissas in FIG. 4A represents a position of a substrate in the deposition chamber (that shows on which target is the substrate located during vapor deposition), and the axis of ordinate in FIG. 4B represents a thickness of the film containing fluoroplastics 402 corresponding to FIG. 4A.

The film containing fluoroplastics 402 according to Embodiment Mode 2 is formed by depositing these films (402a, 402b, 402c, 402d) sequentially that have different contents of fluoroplastics and metallic oxides from each other. In this case, either case that each interface is present or not present is included. Here, the film 402d formed on top of the surface is containing fluoroplastics, however, containing mainly metallic oxides. Consequently, characteristics thereof resemble that of metallic oxides. In addition, another film can be stacked thereon and patterning can be carried out thereon since this case is different from the case that the film containing fluoroplastics is formed to contain mainly fluoroplastics.

Figure 5A:
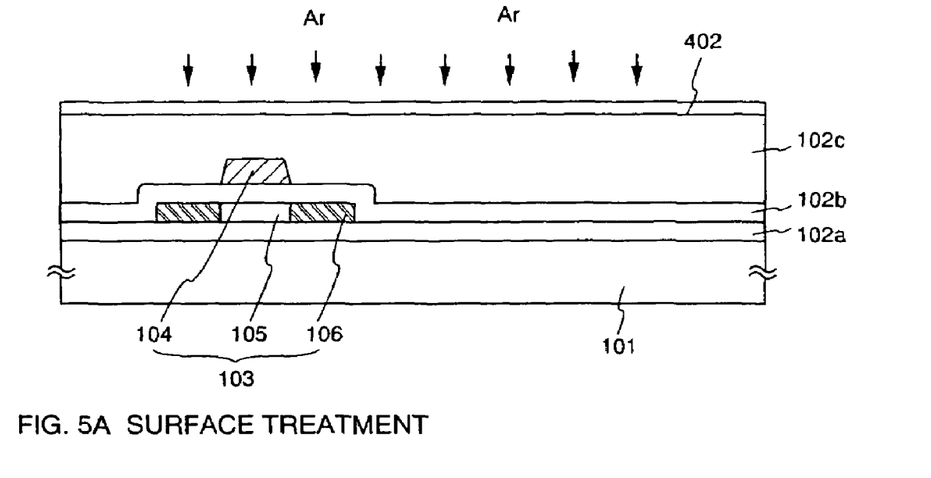
FIGS. 5A to 5C are views showing patterning of a film containing fluoroplastics.

Next, as shown in FIG. 5A, the insulating film 102c is formed to cover the TFT 103 formed on the first substrate, and the film containing fluoroplastics 402 is formed, and then, irregularities are formed on the surface of the film containing fluoroplastics 402 in the process of reverse sputtering.

Figure 5B:
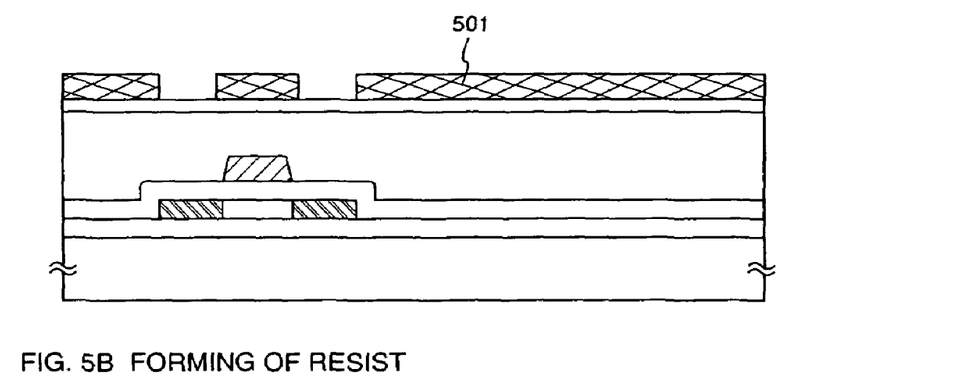
Figure 5C:
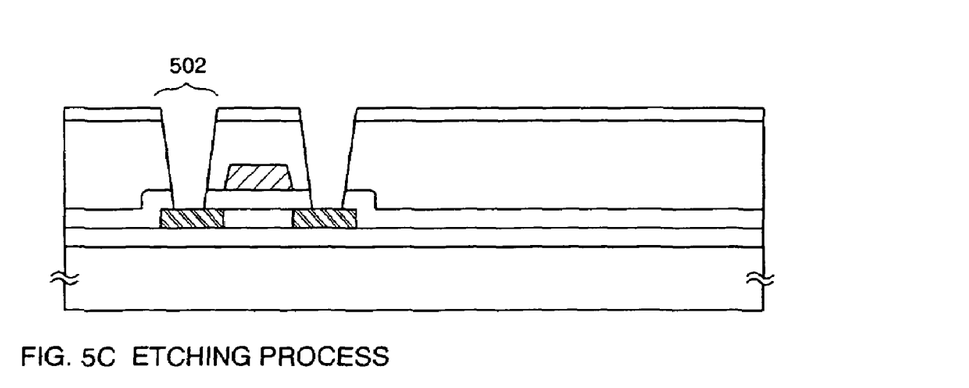

A resist 501 is formed at the predetermined position as shown in FIG. 5B, and etching is carried out using the resist 501 as masks, and then, a contact hole 502 is formed as shown in FIG. 5C. The contact hole 502 that reaches to a source region or a drain region of each TFT is formed by etching off a stack of the film containing fluoroplastics 402, the insulating film 102c, and the insulating film 102b sequentially by dry etching technique under the following conditions.

First, the film containing fluoroplastics 402 is etched off under the condition, that is, $CHF_3$ gas used as process gas is 35 sccm; RF (13.56 MHz) electric power applied to the substrate side (sample stage) is 500 W; RF (13.56 MHz) electric power applied to a coil type electrode is 450 W; and pressure is 3.3 Pa.

Second, the insulating film 102c is etched off. In this embodiment mode, the insulating film 102c is formed of an acrylic film that is formed by coating to have a thickness from 1.0 to 1.2 μm. In addition, an organic material such as acrylic, polyimide, polyamide, polyimideamide, BCB (benzocyclobutene), or the like is also useful. Forming the insulating film of an organic material gives the good flatness on the film surface, in addition, parasitic capacitance can be reduced since an organic material has generally low dielectric constant.

The etching condition, that is, gas flow of $CF_4$, $O_2$, and He used as process gas is in a ratio of 5:95:40 sccm; RF (13.56 MHz) electric power applied to the substrate side (sample stage) is 500 W; RF electric power (13.56 MHz) applied to a coil type electrode is 450 W; and pressure is 66.5 Pa.

Third, the insulating film 102b is etched off. The insulating film 102b is formed of an inorganic material such as silicon oxide, silicon oxynitride, or the like by PCVD or sputtering.

The etching condition, that is, gas flow of $CHF_3$ used as process gas is 35 sccm; RF (13.56 MHz) electric power applied to the substrate side (sample stage) is 400W; and RF (13.56 MHz) electric power applied to a coil type electrode is 450W; and pressure used is 40 Pa.

Therefore after the contact hole 502 is formed, the wiring 107, the first electrode 108, the insulator 109, the electroluminescent layer 110, and the second electrode 111 are formed as shown in FIG. 2, respectively. The material and the fabrication method for forming these films are much the same as Embodiment Mode 1 and will not be further explained.

Also in Embodiment Mode 2, the film containing fluoroplastics 112 and the inorganic insulating film 113 can be formed on the second electrode 111 as shown in Embodiment Mode 1. To fabricate these films, refer to Embodiment Mode 1.

The film containing fluoroplastics 201 in Embodiment Mode 2 can be patterned and another film can be stacked thereon, so that the film containing fluoroplastics 201 can be formed as a protective film for protecting a light-emitting device against moisture or oxygen before forming a wiring and a first electrode for the light-emitting device.

The film containing fluoroplastics 201 can prevent moisture or gas such as oxygen from penetrating a portion of the deposited film into the light-emitting device, which will cause deterioration of the light-emitting device. Particularly, the film containing fluoroplastics 201 is effective in the case that an organic resin film that is superior in coverage is used for the insulating film 102c serving as the interlayer insulating film shown in FIG. 2, since moisture or gas such as oxygen is easy to be released.

Embodiment Mode 3

In Embodiment Mode 3, measured results of the characteristics of the film containing fluoroplastics used in the present invention will be described. A film used for the measurement is the film containing fluoroplastics formed to have a thickness of 100 nm by using target of polytetrafluoroethylene by sputtering under the conditions, that is, Ar gas used as process gas is 30 sccm; sputtering pressure used is 0.4 Pa; electric power, 400 W; and the substrate temperature, 300° C.

Figure 8:
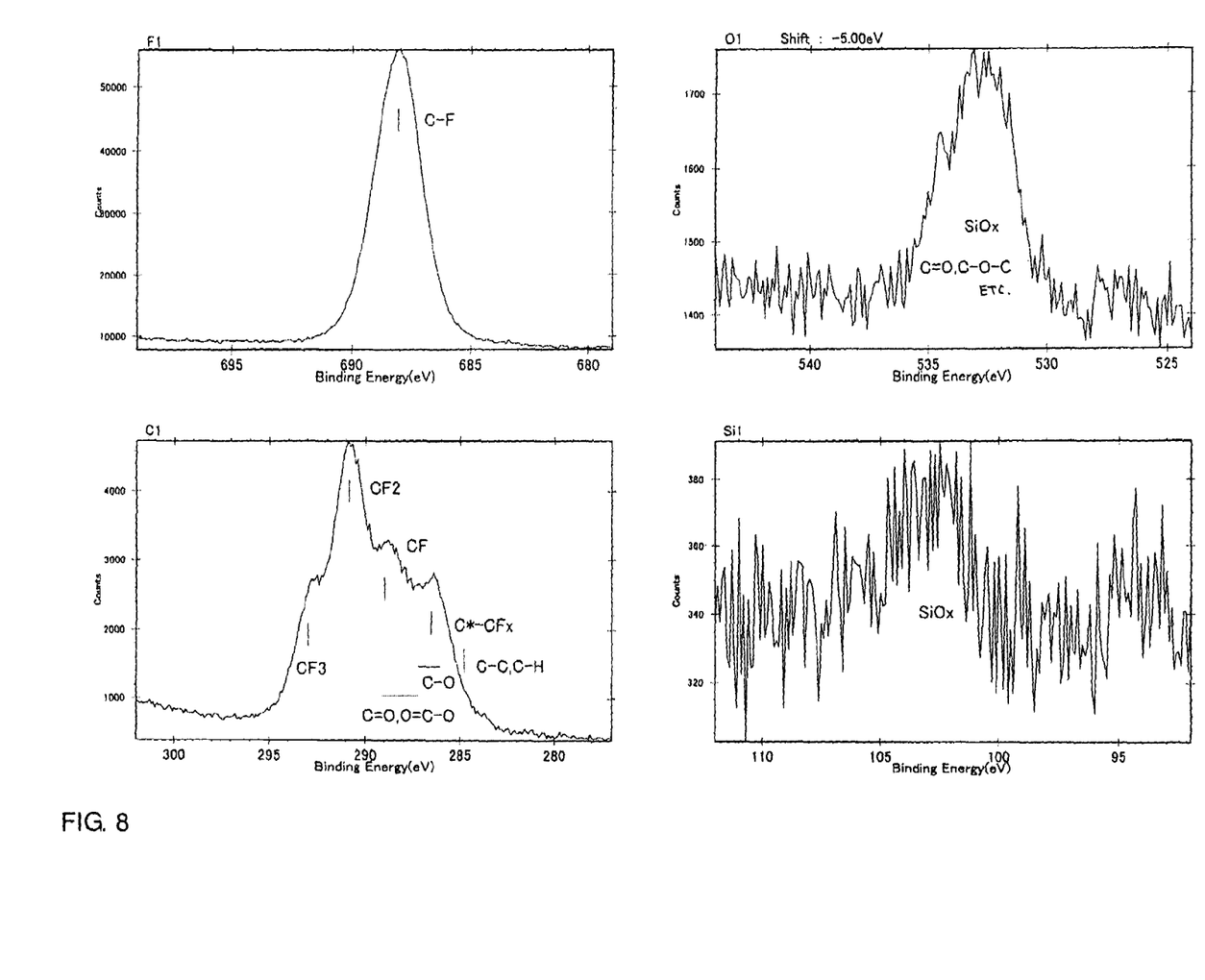
FIG. 8 is a view showing the ESCA measured results of a film containing fluoroplastics.

FIG. 8 is a view showing spectrums of ESCA (photoelectron spectroscopy for chemical analysis). Chemical composition of fluoride, oxygen, carbon, and silicon in the sample is in a ratio of 61:<1:38:<0.

Figure 9:
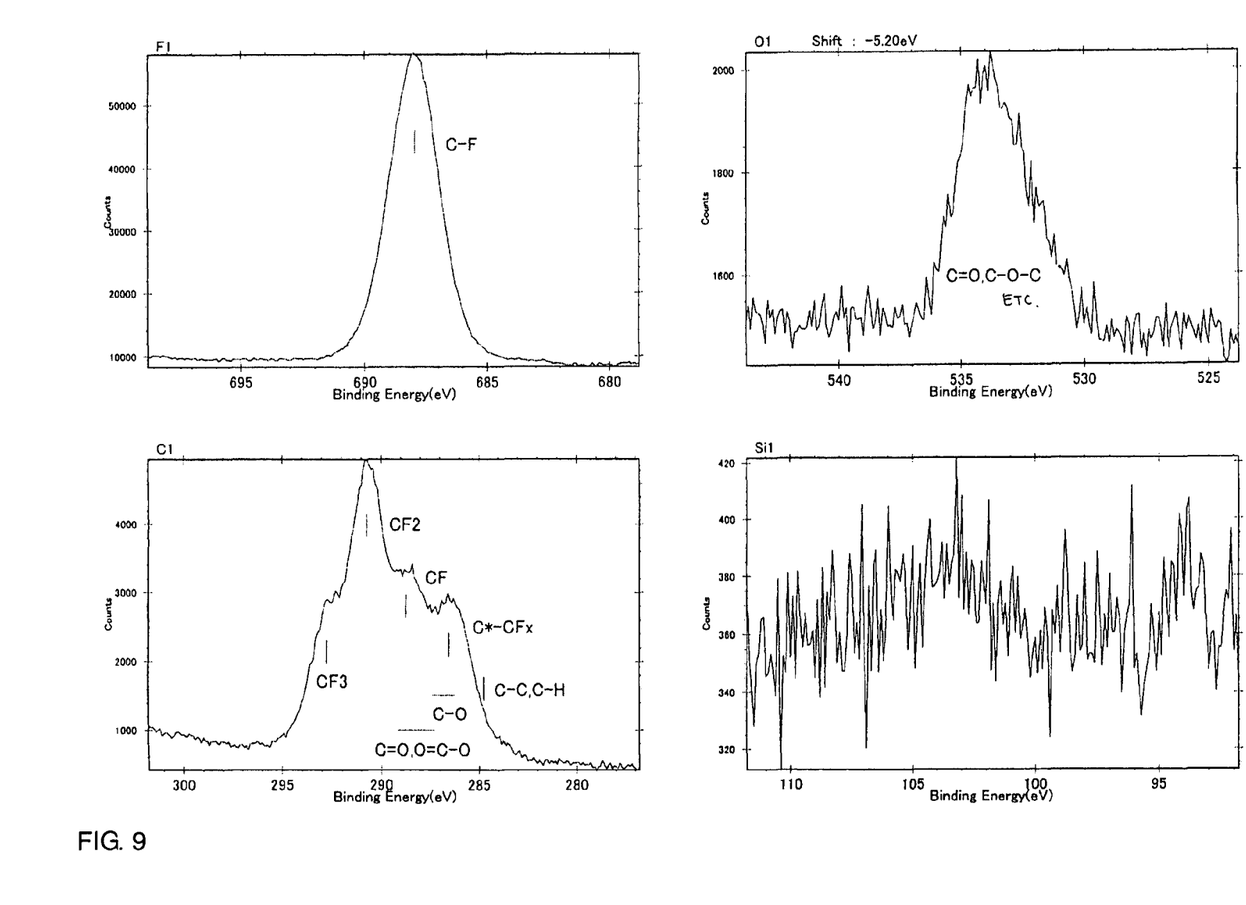
FIG. 9 is a view showing the ESCA measured results of a film containing fluoroplastics.

Measured results of a film formed by much the same measuring method in a different deposition condition is illustrated in FIG. 9. In this case, 30 sccm Ar gas and 5 sccm $O_2$ gas are introduced. The composition ratio is the same as the condition illustrated in FIG. 8.

Figure 10:
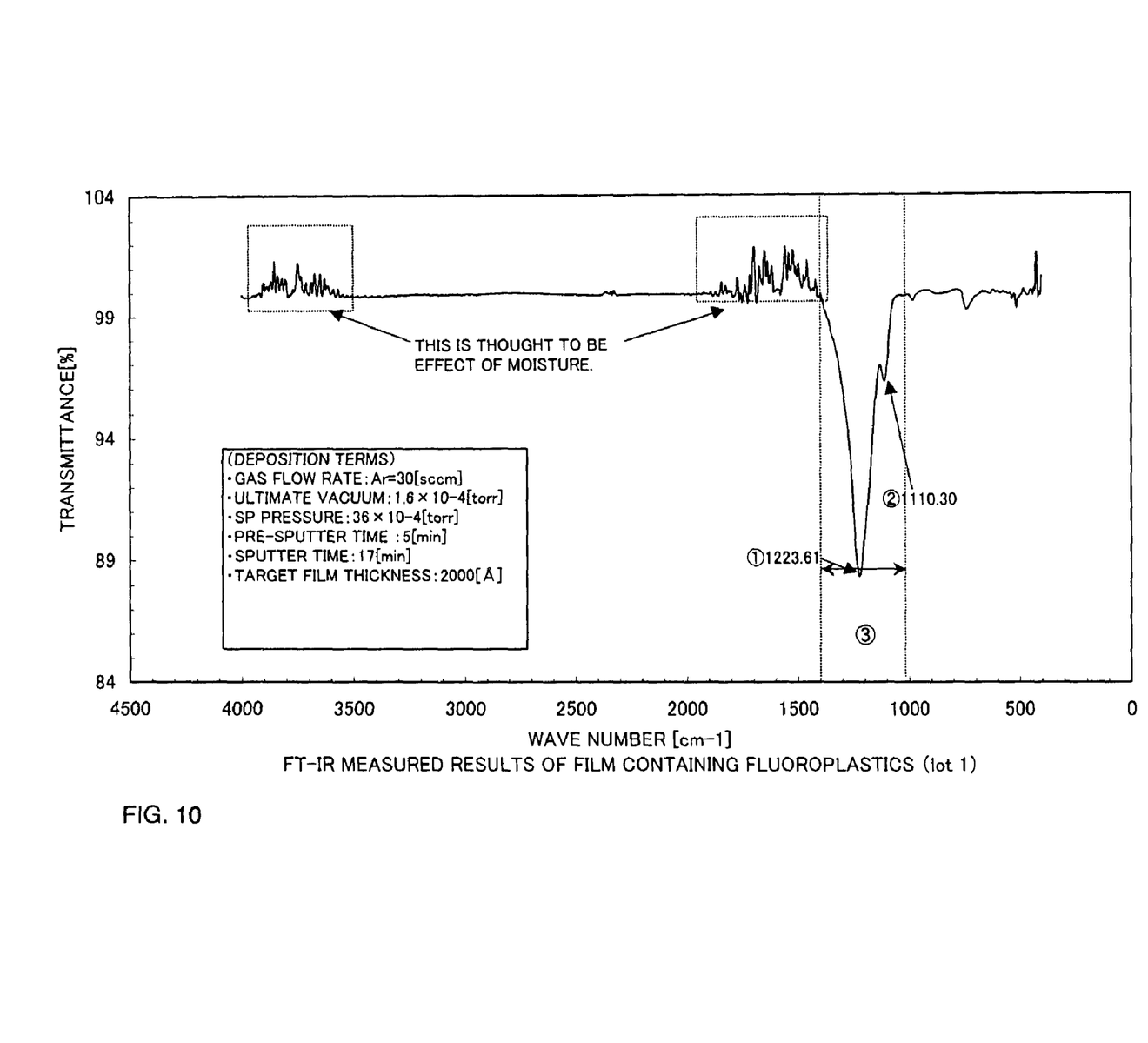
FIG. 10 is a view showing the IR measured results of a film containing fluoroplastics.

FIG. 10 is a graph showing qualitative analysis results by Fourier transform infrared spectroscopy (FT-IR). It is considered that reference numerals 1, 2, and 3 in FIG. 10 represent peaks derived from CF (1100 to 1000 $cm^{-1}$), $CF_2$ (1250 to 1070 $cm^{-1}$), and $CF_3$ (1360 to 1150 $cm^{-1}$). Since the peak represented by numeral 2 is distinctive, it can be thought that $CF_2$ is contained at high rates in the film containing fluoroplastics.

Embodiment Mode 4

Figure 6A:
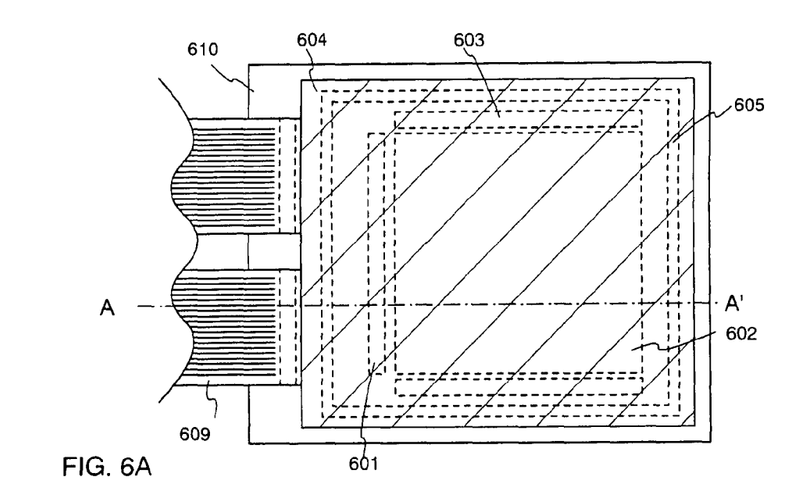
FIGS. 6A and 6B are views showing a sealing structure of a light-emitting apparatus according to the present invention.
Figure 6B:
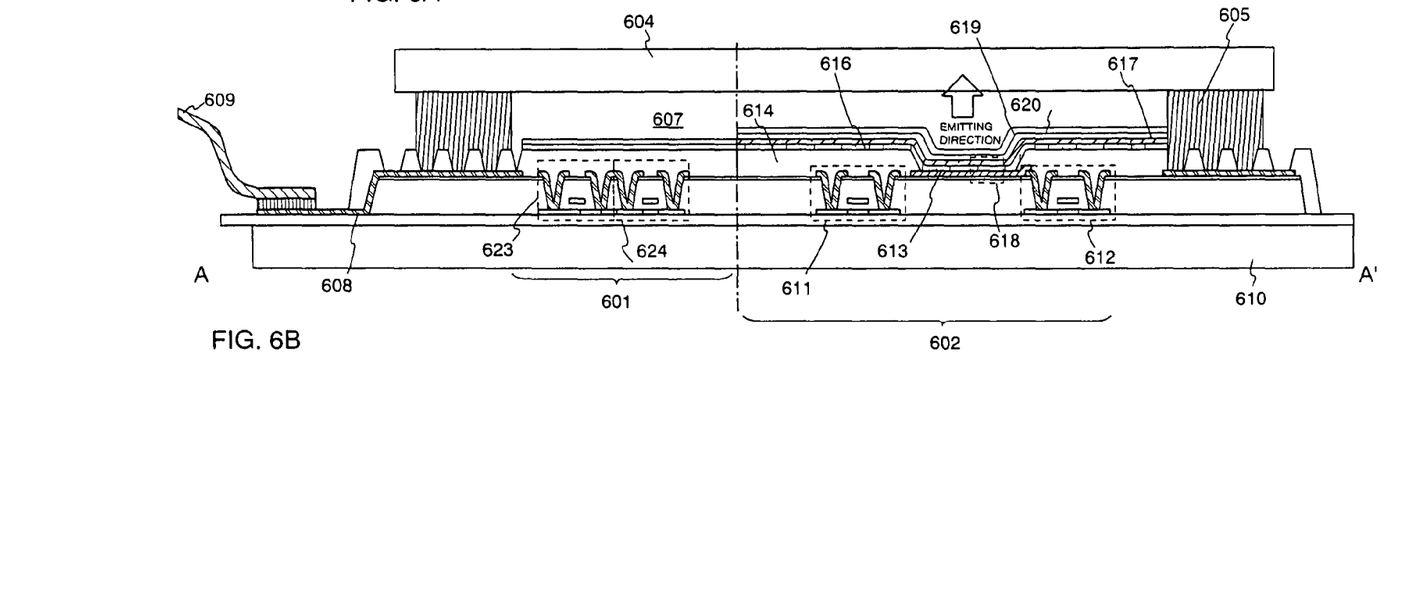

In Embodiment Mode 4, the external view of an active matrix type light-emitting device will be described with reference to FIG. 6. FIG. 6A is a top surface view of a light-emitting device and FIG. 6B is a cross-sectional view taken along the line of A-A' of FIG. 6A. Reference numeral 601 indicated by a dotted line is a drive circuit portion (a source side drive circuit), 602 is a pixel portion, 603 is a drive circuit portion (a gate side drive circuit), 604 is a sealing substrate, 605 is a sealing agent, and 607 surrounded by the sealing agent 605 is a space.

Reference numeral 608 is a wiring for transmitting signals to be inputted to the source side drive circuit 601 and a gate side drive circuit 603. The wiring 608 receives a video signal, a clock signal, a start signal, a reset signal, or the like from the FPC (a flexible printed circuit) that serves as an external input terminal. Though only the FPC is illustrated here, a PWB (a print wiring board) can be attached to the FPC. The light-emitting device in the specification includes not only a body of light-emitting device but also a light-emitting device in the state of being attached with FPC or PWB.

Next, a cross-sectional structure of a light emitting will be described with reference to FIG. 6B. Here, the source side drive circuit 601 portion that serves as a drive circuit portion and the pixel portion 602 are fabricated on a substrate 610.

The source side drive circuit 601 is a CMOS circuit that is formed by combining an n-channel TFT 623 and a p-channel TFT 624. A TFT for forming a drive circuit may be formed of a known CMOS circuit, PMOS circuit, or NMOS circuit. A drive circuit is formed on a substrate that is referred to a driver integrated type is described in this embodiment mode, but not exclusively, the drive circuit may be formed outside.

The pixel portion 602 comprises a switching TFT 611, a current control TFT 612, and a first electrode 613 that connects electrically to a drain of the current control TFT 612. An insulator 614 is formed to cover the edge portion of the first electrode 613. Here, the insulator 614 is formed of a positive type photosensitive acrylic resin film.

To improve coverage, the upper end portion or the bottom end portion of the insulator 614 is formed to have a curved surface having curvature. For example, in the case that the a positive type photosensitive acrylic is used as a material for the insulator 614, it is preferable that only the upper edge portion of the insulator 614 is formed to have a curved surface having radius of curvature (0.2 to 3 μm). Either a negative type that is a soluble material in etchant according to photosensitive light or a positive type that is dissoluble in etchant according to light can be used as an insulator 614.

An electroluminescent layer 616 and a second electrode 617 are formed respectively on the first electrode 613. Here, as a material for forming the first electrode 613, it is preferable to use a large work function materials. For example, a single layer of a titanium nitride film, a chrome film, a tungsten film, a Zn film, or Pt film, or a lamination of a film containing titanium nitride and aluminum as its main components and the above single layer, or a three-layer lamination of the film containing titanium nitride and aluminum as its main components, a titanium nitride film, and the above single layer, are useful for the first electrode 613. By forming the first electrode to have a lamination structure, resistance as a wiring can be low forming the ohmic contact to the electroluminescent layer 616. In addition, the first electrode can serve as an anode.

The electroluminescent layer 616 is formed by vapor deposition using an evaporation mask or ink-jetting.

As a material for the second electrode (cathode) 617 formed on the electroluminescent layer 616, a small work function material (Al, Ag, Li, Ca, or alloy of these materials such as MgAg, MgIn, AlLi, $CaF_2$, or CaN) is useful. Here, the second electrode (cathode) 617 is formed of a lamination of a thin metal film, a transparent conductive film (Indium-tin-oxide (ITO), indium oxide-zinc oxide ($In_2O_3$—ZnO), zinc oxide (ZnO), or the like) in order the second electrode to transmit light.

The second electrode 617 serves as a wiring in common with all of the pixels and connects electrically to the FPC 609 via a connection wiring 608.

A film containing fluoroplastics 619 is formed on the second electrode 617 by sputtering. Fluoroplastics such as polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like is useful for forming the film containing fluoroplastics 619.

Reverse sputtering can be carried out on the surface of the film containing fluoroplastics 619 as shown in Embodiment Mode 1, however, instead of the reverse sputtering, a film obtained by mixture of fluoroplastics and metallic oxides can be used. With respect to the surface preparation method or deposition condition, refer to Embodiment Mode 1 or Embodiment Mode 2.

An inorganic insulating film 620 is formed on the film containing fluoroplastics 619. A silicon nitride film, a silicon oxide film, a silicon oxynitride film (SiNO film (in a composition ratio of N>O) or SiON film (in a composition ratio of N<O)) or a thin film containing carbon as its main components (for example, a DLC film, a CN film, or the like) formed by sputtering, CVD, or vapor deposition may be useful for the inorganic insulating film 620.

By covering a light-emitting device 618 by the film containing fluoroplastics 619 and the inorganic insulating film 620, deterioration of the light-emitting device 618 due to penetration of moisture or gas such as oxygen into the light-emitting device 618 can be prevented. Further, the above described effects can be more enhanced by bonding the sealing substrate 604 to the substrate 610 using the sealant 605.

Therefore the light-emitting device 618 is encapsulated in the space enclosed with the substrate 610, the sealing substrate 604, and the sealant 605.

It is preferable to use epoxy resin for forming the sealant 605. Further, preferably, these materials transmit little moisture or gas such as oxygen.

In this embodiment mode, in addition to a glass substrate, a quartz substrate, or the like, a plastic substrate of a FRP (fiberglass-reinforced plastics), a PVF (polyvinyl fluoride), a myler, a polyester, acrylic, or the like are useful for the sealing substrate 604.

Thus, it becomes possible to prevent moisture or gas such as oxygen or the like, which causes deterioration of the light-emitting device, from penetrating into the light-emitting device by encapsulating completely the light-emitting device 618 using a film containing fluoroplastics 619, inorganic insulating film 620, and a sealing substrate 620. Consequently, a high reliable light-emitting device can be obtained.

This embodiment mode can be freely combined with Embodiment Mode 1 to Embodiment Mode 3.

Embodiment Mode 5

Since the light-emitting apparatus using a light-emitting device is a self-luminous type, it has high visibility in a light place and a wide viewing angle. Therefore various electric appliances can be completed by employing the light-emitting apparatus according to the present invention.

Given as examples of electric appliances employing a light-emitting apparatus fabricated according to the present invention are: a video camera; a digital camera; a goggle type display (head mounted display); a navigation system; an audio reproducing device (car audio, an audio component, etc.); a laptop computer; a game machine; a portable information terminal (a mobile computer, a cellular phone, a portable game machine, an electronic book, etc.); and an image reproducing device (specifically, a device that is equipped with a display device for reproducing data in a recording medium such as a digital versatile disk (DVD)). The light-emitting apparatus using a light-emitting device is desirable particularly for a portable information terminal since its screen is often viewed obliquely and is required to have a wide viewing angle. Specific examples of the electric appliances are shown in FIGS. 7A to 7H.

Figure 7A:
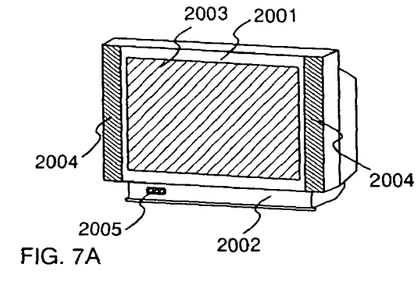
FIGS. 7A to 7H are views showing electric appliances.

FIG. 7A shows a display device, which comprises a casing 2001, a supporting base 2002, a display unit 2003, speaker units 2004, a video input terminal 2005, etc. The light-emitting apparatus to which the light-emitting device according to the present invention is applied can be used for the display unit 2003. The light-emitting apparatus having a light-emitting device is a self-luminous type and does not need a backlight, so that is can be formed into a thinner display device than that of a liquid crystal display device. The term display device includes all of the display device for displaying information such as one for a personal computer, one for receiving TV broadcasting, and one for advertisement.

Figure 7B:
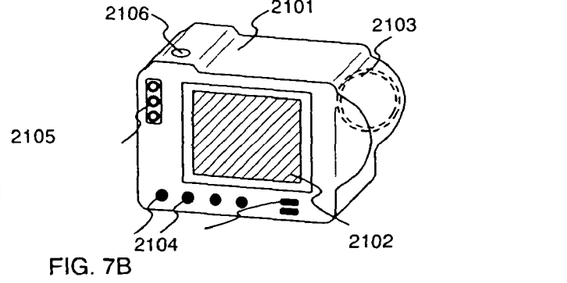

FIG. 7B shows a digital still camera, which comprises a main body 2101, a display unit 2102, an image receiving unit 2103, operation keys 2104, an external connection port 2105, a shutter 2106, etc. The digital still camera can be completed by using the light-emitting apparatus according to the present invention as the display unit 2102.

Figure 7C:
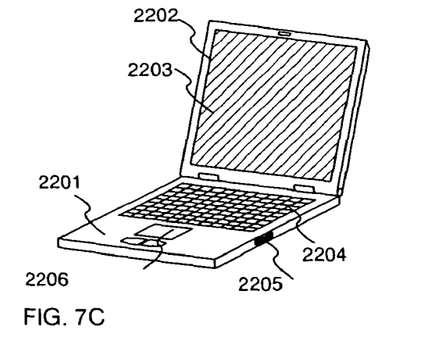

FIG. 7C shows a laptop computer, which comprises a main body 2201, a casing 2202, a display unit 2203, a keyboard 2204, an external connection port 2205, a pointing mouse 2206, etc. The laptop computer can be completed by using the light-emitting apparatus according to the present invention as the display unit 2203.

Figure 7D:
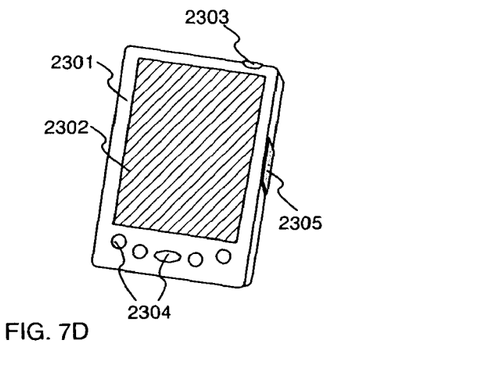

FIG. 7D shows a mobile computer, which comprises a main body 2301, a display unit 2302, a switch 2303, operation keys 2304, an infrared ray port 2305, etc. The mobile computer can be completed by using the light-emitting apparatus according to the present invention as the display unit 2302.

Figure 7E:
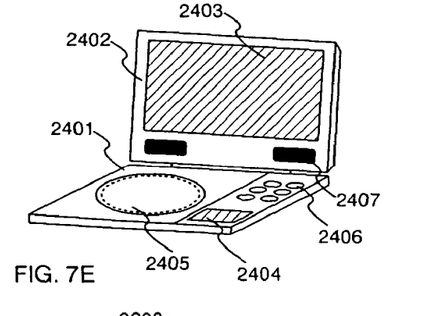

FIG. 7E shows a portable image reproducing device equipped with a recording medium (a DVD player, to be specific). The device comprises a main body 2401, a casing 2402, a display unit A 2403, a display unit B 2404, a recording medium (DVD, or the like) reading unit 2405, operation keys 2406, speaker units 2407, etc. The display unit A 2403 mainly displays image information whereas the display unit B 2404 mainly displays text information. The portable image reproducing device can be completed by using the light-emitting apparatus according to the present invention as the display units A 2403 and B 2404. The term image reproducing device equipped with a recording medium includes video game machines.

Figure 7F:
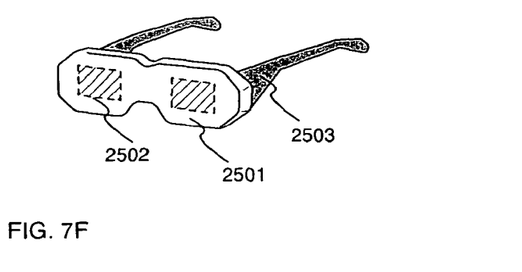

FIG. 7F shows a goggle type display (head mounted display), which comprises a main body 2501, display units 2502, and arm units 2503. The mobile computer can be completed by using the light-emitting apparatus according to the present invention as the display units 2502.

Figure 7G:
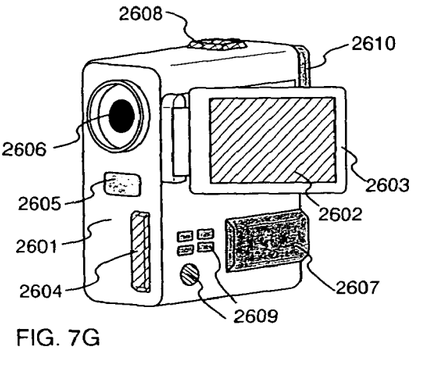

FIG. 7G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, an eye piece 2610, etc. The video camera can be completed by using the light-emitting apparatus according to the present invention as the display unit 2602.

Figure 7H:
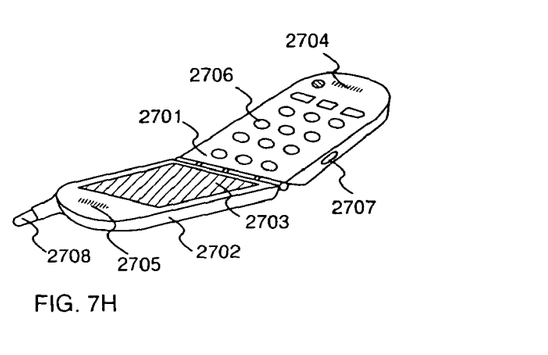

FIG. 7H shows a cellular phone, which comprises a main body 2701, a casing 2702, a display unit 2703, an audio input unit 2704, an audio output unit 2705, operation keys 2706, an external connection port 2707, an antenna 2708, etc. The video camera can be completed by using the light-emitting apparatus according to the present invention as the display unit 2703. If the display unit 2703 displays white characters on a black background, power consumption of the cellular phone can be reduced.

If the luminance of electroluminescence generated in organic compound materials is increased in future, the light-emitting apparatus can be employed also in a front or rear projector in which light bearing outputted image information is magnified by a lens or the like to be projected on a screen.

The electric appliances given in the above often displays information distributed through electronic communication lines such as Internet and CATV (cable television), especially, animation information with increasing frequency. The light-emitting apparatus is suitable for displaying animation information since organic light emitting materials have fast response speed.

In the light-emitting apparatus, portions that emit light consume power. Therefore it is desirable to display information such that as small portions as possible emit light. Accordingly, if the light-emitting apparatus is used for a display unit that mainly displays text information such as a portable information terminal, in particular, a cellular phone, and an audio reproducing device, it is desirable to assign light emitting portions to display text information while portions that do not emit light serve as the background.

As described above, the application range of the light-emitting apparatus according to the present invention is very wide and electric appliances of every field can employ the device. The electric appliances in Embodiment Mode 5 may use any of the structures shown in Embodiment Mode 1 to Embodiment Mode 4.

According to the present invention, by covering a light-emitting device with a film containing fluoroplastics in which fluoroplastics content is controlled, not only deterioration of the light-emitting device due to penetration of moisture or gas such as oxygen thereinto can be prevented, but also another film can be stacked on the film containing fluoroplastics. That is, since a high-hardness inorganic insulating film can be formed on the film containing fluoroplastics, a function of enhancing tolerance for external shocks from outside can be given to the light-emitting device in addition to the above described function that is given from the film containing fluoroplastics.

PARTS LIST

101 substrate
102 (102a to 102c) insulating film
103 TFT
104 gate electrode
105 channel-forming region
106 impurity region
107 wiring
108 first electrode
109 insulating film
110 electroluminescent layer
111 second electrode
112 film containing fluoroplastics
113 inorganic insulating film

What is claimed is:

1. A light-emitting apparatus having a light-emitting device comprising:
   a substrate;
   a thin film transistor over the substrate;
   an insulating film over the thin film transistor;
   a first electrode over the insulating film and electrically connected to the thin film transistor;
   a second electrode over the first electrode;
   an electroluminescent film disposed between the first electrode and the second electrode;
   a mixed film containing fluoroplastics and metallic oxide formed over the second electrode; and
   an inorganic insulating film formed over the mixed film containing fluoroplastics and metallic oxide,
   wherein:
   the insulating film comprises a first insulating film and a second insulating film formed on the first insulating film;
   the first insulating film comprises a material selected from the group consisting of acrylic, polyamide, and polyimide; and
   the second insulating film comprises fluoroplastics.

2. A light-emitting apparatus having a light-emitting device comprising:
   a substrate;
   a thin film transistor over the substrate;
   an insulating film over the thin film transistor;
   a first electrode over the insulating film and electrically connected to the thin film transistor;
   a second electrode over the first electrode;
   an electroluminescent film disposed between the first electrode and the second electrode;
   a mixed film containing fluoroplastics and metallic oxide formed over the second electrode; and
   an inorganic insulating film formed over the mixed film containing fluoroplastics and metallic oxide,
   wherein:
   the insulating film comprises a first insulating film and a second insulating film formed on the first insulating film;
   the first insulating film is an organic resin film; and
   the second insulating film comprises fluoroplastics.

3. A light-emitting apparatus having a light-emitting device comprising:
   a substrate;
   a thin film transistor over the substrate;
   an insulating film over the thin film transistor;
   a first electrode over the insulating film and electrically connected to the thin film transistor;
   a second electrode over the first electrode;
   an electroluminescent film disposed between the first electrode and the second electrode;
   a film containing fluoroplastics formed over the second electrode; and
   an inorganic insulating film formed over the film containing fluoroplastics,
   wherein:
   the insulating film comprises a first insulating film and a second insulating film formed on the first insulating film;
   the first insulating film comprises a material selected from the group consisting of acrylic, polyamide, and polyimide; and
   the second insulating film is a mixed film comprising fluoroplastics and metallic oxide.

4. A light-emitting apparatus having a light-emitting device comprising:
- a substrate;
- a thin film transistor over the substrate;
- an insulating film over the thin film transistor;
- a first electrode over the insulating film and electrically connected to the thin film transistor;
- a second electrode over the first electrode;
- an electroluminescent film disposed between the first electrode and the second electrode;
- a film containing fluoroplastics formed over the second electrode; and
- an inorganic insulating film formed over the film containing fluoroplastics, wherein:
- the insulating film comprises a first insulating film and a second insulating film formed on the first insulating film;
- the first insulating film is an organic resin film; and
- the second insulating film is a mixed film comprising fluoroplastics and metallic oxide.

5. A light-emitting apparatus according to claim 3, wherein a ratio of the metallic oxides in the mixed film monotonically increases from a portion of the mixed film distant from the first electrode to a portion of the mixed film close to the first electrode.

6. A light-emitting apparatus according to claim 3, wherein the film containing fluoroplastics is one type of polymer selected from polytetrafluoroethylene, tetrafluoroethylene-hexafluoropropylene copolymer, polychiorotrifluoroethylene, tetrafluoroethylene-ethylene copolymer, polyvinyl fluoride, and polyvinylidene fluoride.

7. A light-emitting apparatus according to claim 4, wherein the film containing fluoroplastics is one type of polymer selected from polytetrafluoroethylene, tetrafluoroethylene-hexafluoropropylene copolymer, polychiorotrifluoroethylene, tetrafluoroethylene-ethylene copolymer, polyvinyl fluoride, and polyvinylidene fluoride.

8. A light-emitting apparatus according to claim 4, wherein a ratio of the metallic oxides in the mixed film monotonically increases from a portion of the mixed film distant from the first electrode to a portion of the mixed film close to the first electrode.

9. A light-emitting apparatus according to claim 1, wherein the light-emitting apparatus is selected from the group consisting of digital still camera, laptop computer, mobile computer, portable image reproducing device, goggle type display, video camera and cellular phone.

10. A light-emitting apparatus according to claim 2, wherein the light-emitting apparatus is selected from the group consisting of digital still camera, laptop computer, mobile computer, portable image reproducing device, goggle type display, video camera and cellular phone.

11. A light-emitting apparatus according to claim 3, wherein the light-emitting apparatus is selected from the group consisting of digital still camera, laptop computer, mobile computer, portable image reproducing device, goggle type display, video camera and cellular phone.

12. A light-emitting apparatus according to claim 4, wherein the light-emitting apparatus is selected from the group consisting of digital still camera, laptop computer, mobile computer, portable image reproducing device, goggle type display, video camera and cellular phone.

13. A light-emitting apparatus according to claim 3, wherein the film containing fluoroplastics has irregularities.

14. A light-emitting apparatus according to claim 4, wherein the film containing fluoroplastics has irregularities.

15. A light-emitting apparatus according to claim 1, wherein:
- the second insulating film is a mixed film comprising fluoroplastics and metallic oxides, and
- a ratio of the metallic oxides in the mixed film monotonically increases from a portion of the mixed film distant from the first electrode to a portion of the mixed film close to the first electrode.

16. A light-emitting apparatus according to claim 2, wherein:
- the insulating film is a mixed film comprising fluoroplastics and metallic oxides, and
- a ratio of the metallic oxides in the mixed film monotonically increases from a portion of the mixed film distant from the first electrode to a portion of the mixed film close to the first electrode.

* * * * *